(12) United States Patent
Kim et al.

(10) Patent No.: US 8,835,902 B2
(45) Date of Patent: Sep. 16, 2014

(54) NANO-STRUCTURED LIGHT-EMITTING DEVICES

(75) Inventors: Joo-sung Kim, Seongnam-si (KR); Taek Kim, Seongnam-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 93 days.

(21) Appl. No.: 13/156,854

(22) Filed: Jun. 9, 2011

(65) Prior Publication Data

US 2012/0153252 A1  Jun. 21, 2012

(30) Foreign Application Priority Data

Dec. 16, 2010  (KR) ................. 10-2010-0129313

(51) Int. Cl.
*H01L 33/06* (2010.01)
*H01L 33/24* (2010.01)
*H01L 33/18* (2010.01)
*H01L 33/08* (2010.01)

(52) U.S. Cl.
CPC ............. *H01L 33/24* (2013.01); *H01L 33/18* (2013.01); *H01L 33/08* (2013.01)
USPC ............... 257/13; 438/20; 438/478; 438/481; 438/47; 438/149

(58) Field of Classification Search
USPC ................. 257/15, E33.01, 9, 14, 13
See application file for complete search history.

(56) References Cited

U.S. PATENT DOCUMENTS

| | | | |
|---|---|---|---|
| 5,600,158 A | 2/1997 | Noto et al. | |
| 2004/0164312 A1* | 8/2004 | Biwa et al. | 257/99 |
| 2008/0296598 A1 | 12/2008 | Wang et al. | |
| 2009/0159869 A1* | 6/2009 | Ponce et al. | 257/13 |
| 2009/0230545 A1* | 9/2009 | Erchak et al. | 257/734 |
| 2010/0226399 A1* | 9/2010 | Nishinaka | 372/38.04 |
| 2011/0049555 A1* | 3/2011 | Engl et al. | 257/98 |
| 2011/0244616 A1* | 10/2011 | Yu et al. | 438/45 |

FOREIGN PATENT DOCUMENTS

| | | |
|---|---|---|
| KR | 100865600 B1 | 10/2008 |
| KR | 100869962 | 11/2008 |
| KR | 100903103 | 6/2009 |
| KR | 1020100099239 | 9/2010 |
| WO | WO-0159819 A1 | 8/2001 |
| WO | WO-2006099211 A2 | 9/2006 |
| WO | WO-2009067983 A1 | 6/2009 |

* cited by examiner

*Primary Examiner* — Chuong A Luu
*Assistant Examiner* — Rodolfo Fortich
(74) *Attorney, Agent, or Firm* — Harness, Dickey & Pierce, P.L.C.

(57) ABSTRACT

A nano-structured light-emitting device (LED) includes: a plurality of nanostructures on a first type semiconductor layer. Each of the plurality of nanostructures includes: a first type semiconductor nanocore on a portion of the first type semiconductor layer; a current spreading layer formed to cover a surface of the first type semiconductor nanocore and formed of an $Al_xGa_{1-x}N(0<x<1)$/GaN superlattice structure; an active layer on the current spreading layer (or on the first type semiconductor nanocore if the current spreading layer is embedded in the first type semiconductor nanocore); and a second type semiconductor layer on the active layer.

19 Claims, 5 Drawing Sheets

NANO-STRUCTURED LIGHT-EMITTING DEVICES

CROSS-REFERENCE TO RELATED APPLICATION(S)

This application claims priority under 35 U.S.C. §119 to Korean Patent Application No. 10-2010-0129313, filed on Dec. 16, 2010, in the Korean Intellectual Property Office, the entire contents of which are incorporated herein by reference.

BACKGROUND

Example embodiments relate to nano-structured light-emitting diodes and methods of manufacturing the same.

DESCRIPTION OF THE RELATED ART

Semiconductor light-emitting devices (LED) are relatively efficient and environment-friendly light sources used in various fields such as displays, optical communications, automobiles, and general illumination. Recently, blue LEDs and ultraviolet-ray LEDs manufactured using nitrides having improved physical and chemical properties have been introduced. White or other monochromatic light may be generated using blue or ultraviolet-ray LEDs and phosphor materials, thereby increasing the application range of LEDs.

The basic operating principle of LEDs is that light is emitted as electrons and holes injected into an active layer combine together. However, crystal defects usually exist in nitride-based compound semiconductor crystals, and if electrons and holes combine through the crystals having defects, heat rather than light energy is emitted.

Crystal defects, which cause non-radiative recombination, are generated due to lattice constant mismatches and/or differences in thermal expansion coefficients between a growth substrate and a compound semiconductor. By utilizing one-dimensional growth, a nano-structure may be less affected by lattice constant mismatch, or difference in thermal expansion coefficients between a substrate and a thin film-type structure. Thus, the nano-structure may be grown more easily over a larger surface area on a heterogeneous substrate.

SUMMARY

Example embodiments provide nano-structured light-emitting devices (LEDs) with increased light-emitting efficiency by mitigating a current concentration.

Example embodiments also provide methods of manufacturing LEDs.

Additional aspects will be set forth in part in the description which follows and, in part, will be apparent from the description, or may be learned by practice of example embodiments.

According to at least one example embodiment, a light-emitting device (LED) includes: a first type semiconductor layer and a plurality of nanostructures. Each of the plurality of nanostructures includes: a first type semiconductor nanocore grown from a selected area on the first type semiconductor layer; a current spreading layer formed to cover a surface of the first type semiconductor nanocore and formed of an $Al_xGa_{1-x}N(0<x<1)/GaN$ superlattice structure; and an active layer and a second type semiconductor layer that are sequentially grown from a surface of the current spreading layer.

According to at least one other example embodiment, a light-emitting device (LED) includes: a plurality of nanostructures on a first type semiconductor layer. Each of the plurality of nanostructures includes: a first type semiconductor nanocore on a portion of the first type semiconductor layer; a current spreading layer formed to cover a surface of the first type semiconductor nanocore and formed of an $Al_xGa_{1-x}N(0<x<1)/GaN$ superlattice structure; an active layer on the current spreading layer; and a second type semiconductor layer on the active layer.

According to at least one other example embodiment, a light-emitting device (LED) includes: a first type semiconductor layer; and a plurality of nanostructures. Each of the plurality of nanostructures includes: a first type semiconductor nanocore grown from a selected area on the first type semiconductor layer; a current spreading layer embedded in the first type semiconductor nanocore and formed of an $Al_xGa_{1-x}N(0<x<1)/GaN$ superlattice structure; and an active layer and a second type semiconductor layer that are sequentially grown from a surface of the first type semiconductor nanocore.

According to at least one other example embodiment, a light-emitting device (LED) includes: a plurality of nanostructures on a first type semiconductor layer. Each of the plurality of nanostructures includes: a first type semiconductor nanocore on a portion of the first type semiconductor layer; a current spreading layer embedded in the first type semiconductor nanocore and formed of an $Al_xGa_{1-x}N(0<x<1)/GaN$ superlattice structure; an active layer on the first type semiconductor nanocore; and a second type semiconductor layer on the active layer.

According to at least some example embodiments, in the current spreading layer, the $Al_xGa_{1-x}N(0<x<1)$ may be undoped and the GaN may be doped with a first type of impurity. Alternatively, in the current spreading layer, the $Al_xGa_{1-x}N(0<x<1)$ and the GaN may be doped with a first type of impurity. A doping density of the $Al_xGa_{1-x}N(0<x<1)$ may be lower than a doping density of the GaN.

The $Al_xGa_{1-x}N(0<x<1)$ of the current spreading layer may be in a range of about $0.1<x<0.3$. Thicknesses of the $Al_xGa_{1-x}N(0<x<1)$ and the GaN of the current spreading layer may each be in the range from about 10 Å to about 100 Å, inclusive.

According to at least some example embodiments, the LED may further include a mask layer formed on a surface of the first type semiconductor layer and including a plurality of through holes. The first type semiconductor nanocore of each of the plurality of nanostructures may be grown through one of the plurality of through holes.

The plurality of nanostructures may have one of a conical and pyramid shape. In this case, the active layers of the plurality of nanostructures may be spaced apart from (e.g., not connected to) one another. Alternatively, the active layers may be connected to one another.

The plurality of nanostructures may have a bar shape.

BRIEF DESCRIPTION OF THE DRAWINGS

These and/or other aspects will become apparent and more readily appreciated from the following description of example embodiments, taken in conjunction with the accompanying drawings in which.

DETAILED DESCRIPTION

Figure 1:
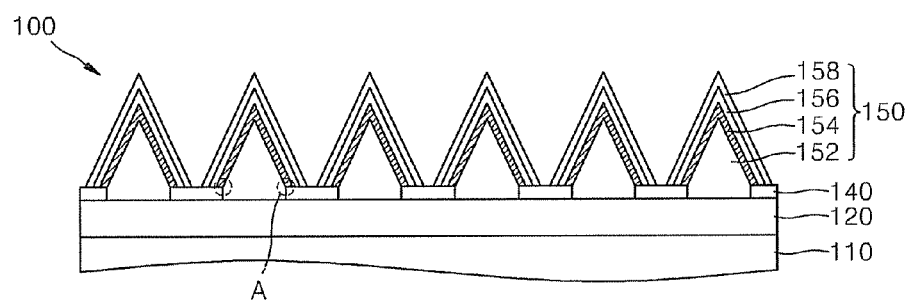
FIG. 1 is a cross-sectional view illustrating a light-emitting device (LED) according to an example embodiment.

Example embodiments will now be described more fully with reference to the accompanying drawings, in which some example embodiments are shown. In the drawings, the thicknesses of layers and regions are exaggerated for clarity. Like reference numerals in the drawings denote like elements.

Detailed illustrative embodiments are disclosed herein. However, specific structural and functional details disclosed herein are merely representative for purposes of describing example embodiments. Example embodiments may be embodied in many alternate forms and should not be construed as limited to only those set forth herein.

It should be understood, however, that there is no intent to limit this disclosure to the particular example embodiments disclosed. On the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of this disclosure. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

FIG. 1 is a cross-sectional view illustrating a light-emitting device (LED) 100 according to an example embodiment.

Referring to FIG. 1, the LED 100 includes a first type semiconductor layer 120 and a plurality of nano-structures 150 formed on the first type semiconductor layer 120. Each of the nano-structures 150 includes: a first type semiconductor nanocore 152, a current spreading layer 154, an active layer 156, and a second type semiconductor layer 158.

The first type semiconductor nanocore 152 is grown from a portion of the first type semiconductor layer 120. The current spreading layer 154 is formed to cover and/or surround a surface of the first type semiconductor nanocore 152. The active layer 156 and the second type semiconductor layer 158 are sequentially grown on a surface of the current spreading layer 154.

Nano-structured light-emitting structures according to at least some example embodiments, may reduce crystal defects and/or increase a light-emitting efficiency.

When conventional nano-structures operate, a current may be concentrated on a given, desired or predetermined location of the nano-structures. According to example embodiments, the current spreading layer 154 suppresses and/or prevents current from concentrating on a given, desired or predetermined location of the nanostructure 150. In one example, if the current spreading layer 154 is not provided, then a current may be concentrated on portions that form a shortest path among a current path extending from the second type semiconductor layer 158 to the first type semiconductor layer 120 during operation of the nano-structures 150. Examples of these portions are the two lower portions of the nano-structures 150 denoted by the dashed circles A in FIG. 1. In this case, recombination for light emission is concentrated on these portions, and thus, the total light-emitting efficiency of the nano-structures 150 decreases.

According to at least the example embodiment shown in FIG. 1, the current spreading layer 154 distributes current, thereby suppressing and/or preventing current from concentrating on a given, desired or predetermined location of the nanostructure 150. The current spreading layer 154 may be formed before forming the active layer 156 to induce uniform radiative recombination for all or substantially all of the nano-structures 150, thereby increasing light-emitting efficiency.

The current spreading layer 154 may be formed of, for example, an AlGaN/GaN superlattice structure. A heterojunction structure as described above may be formed by forming a two-dimensional electron gas layer between an AlGaN layer and a GaN layer to generate a current spreading effect. At the same time, the current spreading effect may increase as a result of the superlattice structure of the AlGaN layer having a relatively high resistance compared to the GaN layer.

An example structure of the LED 100 will now be described in more detail.

Still referring to FIG. 1, according to at least this example embodiment, a substrate 110 is a growth substrate for single crystal growth of a semiconductor. In one example, the substrate 110 may be a silicon (Si) substrate, a silicon carbide (SiC) substrate, a sapphire substrate or the like. Also, a substrate formed of a material that is appropriate for growing the first type semiconductor layer 120 that is to be formed on the substrate 110 (e.g., ZnO, GaAs, $MgAl_2O_4$, MgO, $LiAlO_2$, $LiGaO_2$, GaN, or the like) may be used as the substrate 110.

The first type semiconductor layer 120 is formed on the substrate 110. The first type semiconductor layer 120 is a semiconductor layer doped with a first type of impurity. In one example, the first type semiconductor layer 120 may be formed of a Group III-V nitride semiconductor material. For example, the first type semiconductor layer 120 may be formed of a semiconductor material such as $Al_xGa_yIn_zN$ ($0 \leq x \leq 1$, $0 \leq y \leq 1$, $0 \leq z \leq 1$, $x+y+z=1$) doped with an n-type impurity. Examples of the n-type impurities include Si, Ge, Se, Te or the like.

A mask layer 140 having a plurality of through holes is formed on the first type semiconductor layer 120. The plurality of through holes are formed where the first type semiconductor nanocore 152 of the nano-structures 150 are to be selectively formed. The mask layer 140 is formed of an insulating material such as, for example, a silicon oxide, a silicon nitride, or the like. In one example, the insulating material may be $SiO_2$, SiN, $TiO_2$, $Si_3N_4$, $Al_2O_3$, TiN, AlN, $ZrO_2$, TiAlN, TiSiN or the like. The mask layer 140 may be formed by forming a layer of one of these insulating materials on the first type semiconductor layer 120 and etching the layer to a desired through hole pattern using a lithography process. Through holes may have a circular, oval, polygonal, or similarly shaped cross-section.

Although not shown in FIG. 1, a buffer layer needed for epitaxy growth may be formed between the substrate 110 and the first type semiconductor layer 120. The first type semiconductor layer 120 may have a multi-layer structure.

The first type semiconductor nanocore 152 is formed of a semiconductor material doped with a first conductivity type impurity. The first conductivity type impurity is the same as that of the first type semiconductor layer 120. In one example, the first type semiconductor nanocore 152 may be formed of n-$Al_xGa_yIn_zN$ ($0 \leq x \leq 1$, $0 \leq y \leq 1$, $0 \leq z \leq 1$, and $x+y+z=1$). The first type semiconductor nanocore 152 may be vertically grown from the first type semiconductor layer 120 through the through holes formed in the mask layer 140. The first type semiconductor nanocore 152 may have circular, oval, polygonal, or similarly shaped cross-sections according to the shape of the through holes.

The current spreading layer 154 may be formed of an $Al_xGa_{1-x}N(0<x<1)$/GaN superlattice structure. In the current spreading layer 154, GaN may be doped with a first type of impurity, and the $Al_xGa_{1-x}N(0<x<1)$ may be undoped or doped with the first type of impurity at a lower doping density than GaN. The order or number of layers of the superlattice structure of $Al_xGa_{1-x}N(0<x<1)$/GaN may be modified variously.

$Al_xGa_{1-x}N(0<x<1)$ of the current spreading layer 154 may be in a range of about $0.1<x<0.3$. Thicknesses of $Al_xGa_{1-x}N$ ($0<x<1$) and GaN may each be in the range from about 10 Å to about 100 Å, inclusive.

The active layer 156 emits light by recombination of electrons and holes. The active layer 156 may have a single quantum well structure or a multi-quantum well structure formed by adjusting band gaps by periodically varying values of x, y, and z of $Al_xGa_yIn_zN$. In one example, a quantum well structure may be formed by a quantum well layer and a barrier layer arranged in pairs such as InGaN/GaN, InGaN/InGaN, InGaN/AlGaN, or InGaN/InAlGaN. A wavelength band of light emission may be adjusted by controlling a band gap energy according to a mole fraction of In in an InGaN layer. In one example, when the mole fraction of In varies by about 1%, a light-emitting wavelength may be shifted by about 5 nm.

When the through holes of the mask layer 140 have a polygonal shape, the first type semiconductor nanocore 152 and the current spreading layer 154 form a pyramid shape, and a surface on which the active layer 156 is to be grown is a semipolar surface such as a (1-101) surface or a (11-22) surface. When the active layer 156 having a quantum well structure is grown on the semipolar surface, spontaneous polarization may be reduced. In addition, because the nano-structures 150 are nano-scale in which strains are reduced, polarization due to a piezoelectric field effect is suppressed and/or prevented, and a quantum confinement stark effect (QCSE) is also suppressed and/or prevented similar to a non-polar surface. Accordingly, crystal defects created when an In content of the active layer 156 increases are reduced, and the In content may be more easily maintained more uniformly throughout the active layer 156.

The second type semiconductor layer 158 is formed to cover a surface of the active layer 156. The second type semiconductor layer 158 may be formed of p-$Al_xGa_yIn_zN$ ($x+y+z=1$) ($0 \leq x \leq 1$, $0 \leq y \leq 1$, $0 \leq z \leq 1$, $x+y+z=1$), and Mg, Zn, Be or the like may be used as a p-type impurity.

Although not shown in FIG. 1, two electrodes, which are respectively electrically connected to the first type semiconductor layer 120 and the second type semiconductor layer 158 and to which a voltage is applied for injecting electrons and holes to the active layer 156, may be formed.

The plurality of nano-structures 150 illustrated in FIG. 1 may have a conical shape. However, the shape of the nano-structures 150 is not limited thereto. Rather, the plurality of nano-structures 150 may be a pyramid, a bar, a combination thereof, or the like. Also, the active layer 156 is formed separately in each of the nano-structures 150, but is not limited thereto. Rather, the active layers 156 of the respective nano-structures 150 may also be connected to one another.

Figure 2:
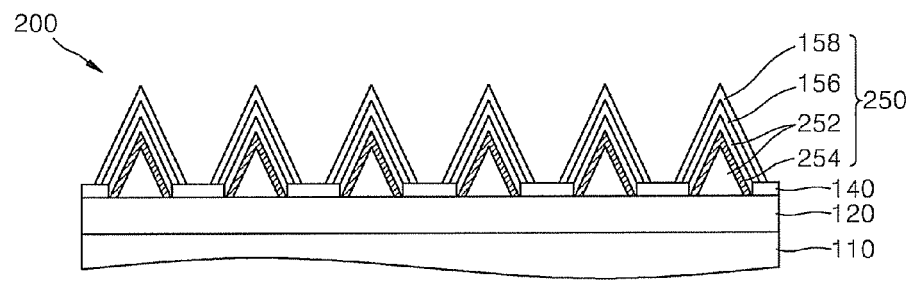
FIG. 2 is a cross-sectional view illustrating a LED according to another example embodiment.

FIG. 2 is a cross-sectional view illustrating a LED 200 according to another example embodiment. The LED 200 is similar to the example embodiment shown in FIG. 1, and thus, similar elements/components will not be described in detail. The example embodiment shown in FIG. 2 differs from that shown in FIG. 1 with respect to the position of the current spreading layer.

Referring to FIG. 2, each nano-structure 250 includes a first type semiconductor nanocore 252, a current spreading layer 254, an active layer 156, and a second type semiconductor layer 158. In this example embodiment, the current spreading layer 254 is embedded in the first type semiconductor nanocore 252. In one example, the current spreading layer 254 is inserted while growing the first type semiconductor nanocore 252 and the first type semiconductor nanocore 252 is further grown from a surface of the current spreading layer 254.

Figure 3:
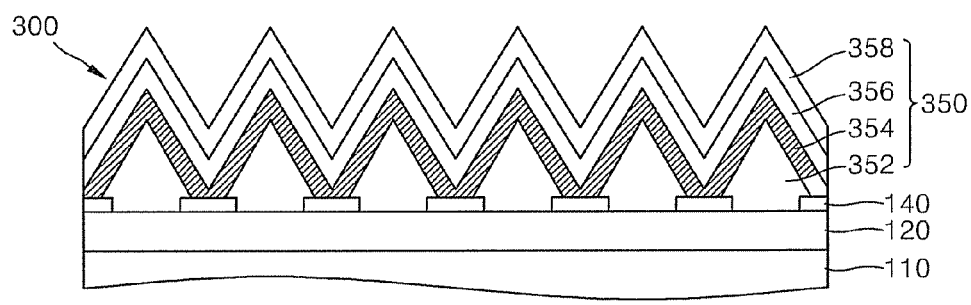
FIG. 3 is a cross-sectional view illustrating a LED according to yet another example embodiment.

FIG. 3 is a cross-sectional view illustrating a LED 300 according to another example embodiment. The LED 300 is similar to the LED 100 shown in FIG. 1, and thus, similar elements/components will not be described in detail. The example embodiment shown in FIG. 3 differs from that shown in FIG. 1 in that the current spreading layers of each nano-structure 350 are connected to one another, the active layers of each nano-structure 350 are connected to one another, and the second type semiconductor layer of each nano-structure 350 are connected to one another. In this structure, leakage current may be further reduced.

In more detail, referring to FIG. 3, the LED 300 includes a plurality of nano-structures 350 formed on the first type semiconductor layer 120. Each of the nano-structures 350 includes: a first type semiconductor nanocore 352, a current spreading layer 354, an active layer 356, and a second type semiconductor layer 358. The first type semiconductor nanocore 352 is grown from a portion of the first type semiconductor layer 120. The current spreading layer 354 is formed to cover and/or surround a surface of the first type semiconductor nanocore 1352. The active layer 356 and the second type semiconductor layer 358 are sequentially grown on a surface of the current spreading layer 354.

In the example embodiment shown in FIG. 3, the current spreading layers 354 of each of the nanostructures 350 are connected to one another. Similarly, the active layers 356 of each of the nanostructures 350 are connected to one another, and the second type semiconductor layers 358 of each of the nanostructures 350 are connected to one another.

Figure 4:
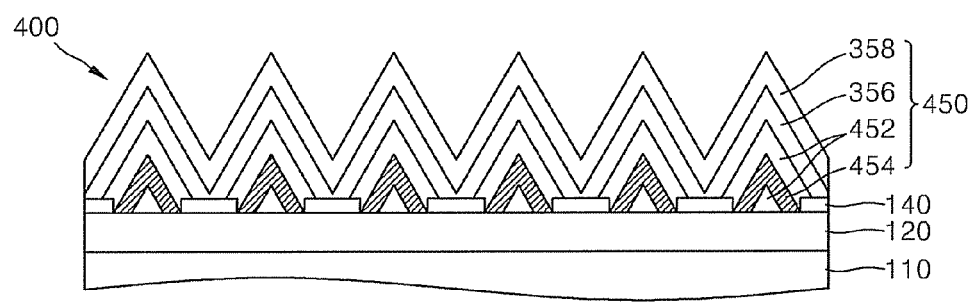
FIG. 4 is a cross-sectional view illustrating a LED according to still another example embodiment.

FIG. 4 is a cross-sectional view illustrating a LED 400 according to another example embodiment. The example embodiment shown in FIG. 4 is similar to that shown in FIG. 3, and thus, similar elements/components will not be described in detail. The example embodiment shown in FIG. 4 differs from that shown in FIG. 3 with respect to the position of the current spreading layer.

Referring to FIG. 4, each nano-structure 450 includes a first type semiconductor nanocore 452, a current spreading layer 454, an active layer 356, and a second type semiconductor layer 358. In this example embodiment, the current spreading layer 454 is embedded in the first type semiconductor nanocore 452. The current spreading layer 454 may be embedded as discussed above with regard to the current spreading layer 254 in FIG. 2.

Figure 5:
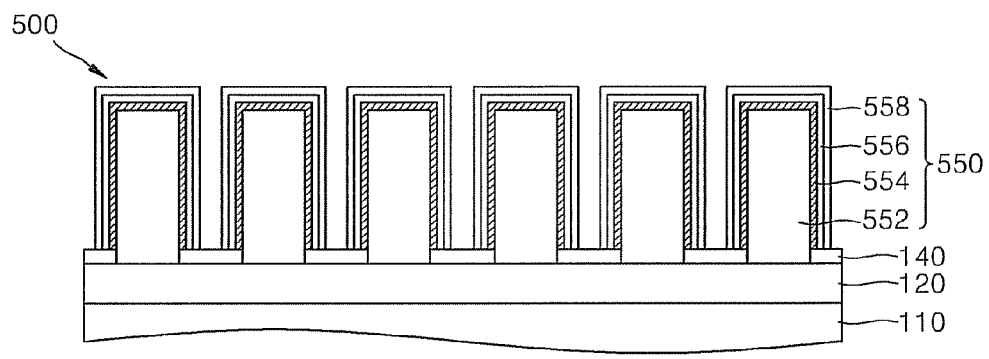
FIG. 5 is a cross-sectional view illustrating a LED according to still another example embodiment.

FIG. 5 is a cross-sectional view illustrating a LED 500 according to another example embodiment. The LED 500 is similar to the light-emitting device 100 shown in FIG. 1 except with regard to the shape of nanostructures 550. In the example embodiment shown in FIG. 5, the nanostructures 550 have a bar shape. In this example, a first type semiconductor nanocore 552 is grown through the through holes of a mask layer 140 to have a given, desired or predetermined thickness. A current spreading layer 554, an active layer 556, and a second type semiconductor layer 558 are sequentially formed from a surface of the first type semiconductor nanocore 552.

Figure 6:
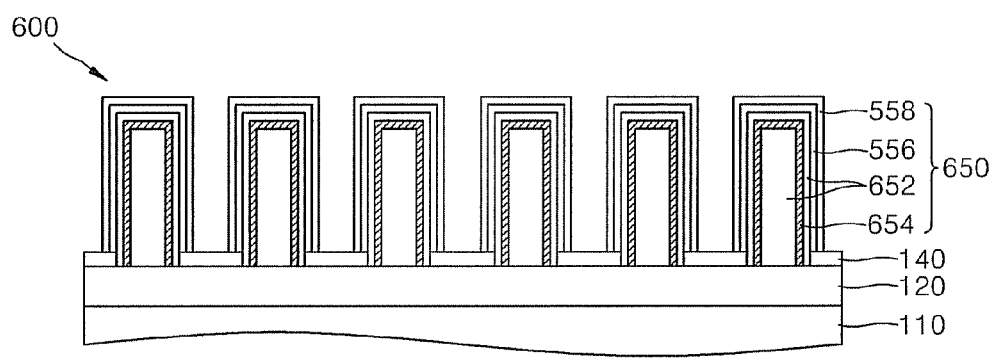
FIG. 6 is a cross-sectional view illustrating a LED according to yet another example embodiment.

FIG. 6 is a cross-sectional view illustrating a LED 600 according to another example embodiment. The LED 600 is similar to the LED 500 of FIG. 5, and thus, similar elements/components will not be described in detail. The example embodiment shown in FIG. 6 differs from that shown in FIG. 5 with respect to the position of the current spreading layer.

In this example embodiment, each nano-structure 650 includes a first type semiconductor nanocore 652, a current spreading layer 654, an active layer 556, and a second type semiconductor layer 558. The current spreading layer 654 is embedded in the first type semiconductor nanocore 652. The current spreading layer 654 may be embedded as discussed above with regard to the current spreading layer 254 in FIG. 2.

The bar-shaped nanostructures 550 and 650 illustrated in FIGS. 5 and 6 have cross-sections with a uniform or substantially uniform width. However, example embodiments are not limited thereto. Rather, for example, tip portions of the nanostructures 550 and 650 may have a conical form or a pyramid form tapering upward.

FIGS. 7A through 7E are cross-sectional views illustrating a method of manufacturing a light-emitting device (LED) according to an example embodiment. The method illustrated by FIGS. 7A through 7E will be described, for example purposes, with regard to the LED 100 shown in FIG. 1.

Figure 7A:
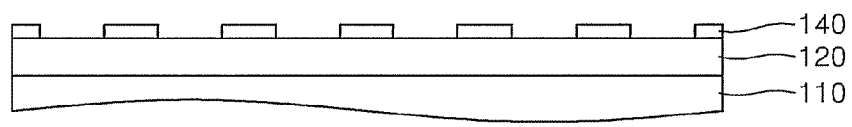
FIGS. 7A through 7E are cross-sectional views illustrating a method of manufacturing a LED according to an example embodiment.

Referring to FIG. 7A, a first type semiconductor layer 120 and a mask layer 140 having a plurality of through holes are formed on a substrate 110.

The substrate 110 may be a silicon (Si) substrate, a silicon carbide (SiC) substrate, a sapphire substrate, or the like. Also, a substrate formed of a material appropriate for growing the first type semiconductor layer 120 that is to be formed on the substrate 110 (e.g., ZnO, GaAs, $MgAl_2O_4$, MgO, $LiAlO_2$, $LiGaO_2$, GaN, or the like) may be used as the substrate 110.

The first type semiconductor layer 120 may be a semiconductor layer doped with a first type of impurity. For example, the first type semiconductor layer 120 may be formed of a Group III-V nitride semiconductor material such as $Al_xGa_y$-$In_zN$ ($x+y+z=1$) ($0 \leq x \leq 1$, $0 \leq y \leq 1$, $0 \leq z \leq 1$, and $x+y+z=1$) doped with an n-type impurity. Examples of the n-type impurities include Si, Ge, Se, Te, or the like. The first semiconductor layer 120 may be formed by using a hydride vapor phase epitaxy (HVPE) method, a molecular beam epitaxy (MBE) method, a metal organic vapor phase epitaxy (MOVPE) method, a metal organic chemical vapor deposition (MOCVD) method, etc.

The mask layer 140 includes an insulating material such as a silicon oxide, a silicon nitride, or the like. For example, the mask layer 140 may be formed of a material including one of: $SiO_2$, SiN, $TiO_2$, $Si_3N_4$, $Al_2O_3$, TiN, AlN, $ZrO_2$, TiAlN, TiSiN, and the like. The mask layer 140 may be formed by forming a layer of one of these insulating materials on the first type semiconductor layer 120 and etching the layer to a desired through hole pattern using a lithography process. Through holes may have a circular, oval, polygonal, or similarly shaped cross-section.

Figure 7B:
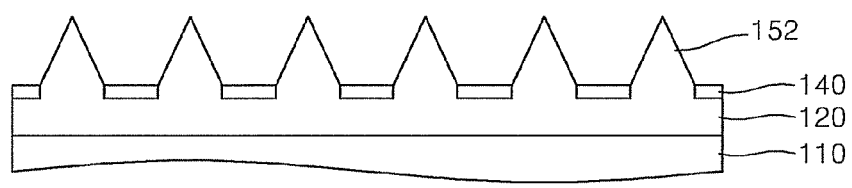

As illustrated in FIG. 7B, a first type semiconductor nanocore 152 is grown from the first type semiconductor layer 120 through the through holes. In FIG. 7B, the first type semiconductor nanocore 152 has a conical shape. However, the shape of the first type semiconductor nanocore 152 is not limited thereto and may be, for example, a pyramid, a bar, or a combination of these shapes.

Figure 7C:
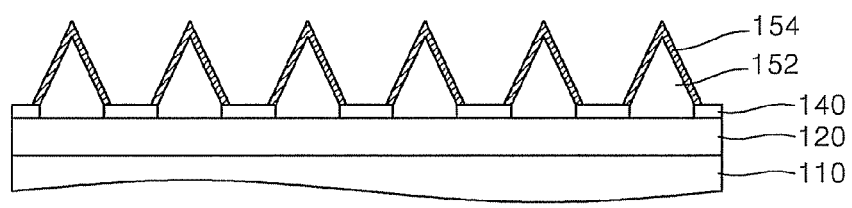

As illustrating in FIG. 7C, a current spreading layer 154 is formed on the first type semiconductor nanocore 152. The current spreading layer 154 is formed of a $Al_xGa_{1-x}N(0<x<1)$/GaN superlattice structure. The order or number of layers of superlattice structure is not limited. Also, as described above with reference to FIGS. 2, 4, and 6, the current spreading layer 154 may be embedded in the first type semiconductor nanocore 152. For example, the current spreading layer 154 may be inserted while growing the first type semiconductor nanocore 152 during the operation illustrated in FIG. 7B, and the first type semiconductor nanocore 152 may be further grown from the surface of the current spreading layer 154.

Figure 7D:
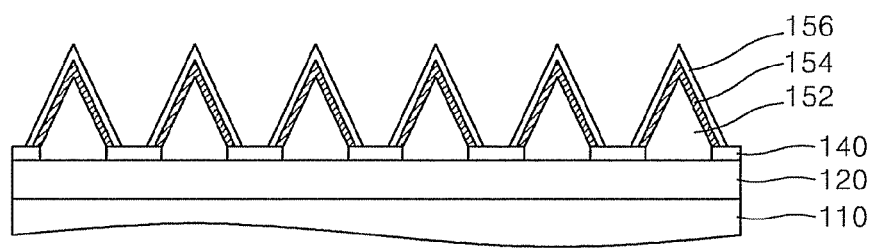
Figure 7E:
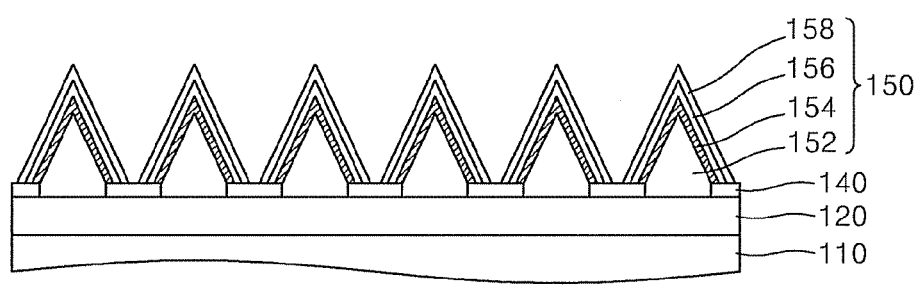

As illustrated in FIG. 7D, an active layer 156 is formed on the current spreading layer 154. If the current spreading layer 154 is embedded in the first type semiconductor nanocore 152, then the active layer 156 is formed on the first type semiconductor nanocore 152. Active layers 156 of the respective nano-structures 150 may or may not be connected to one another. A second type semiconductor layer 158 is then formed on a surface of the active layer 156.

Although not shown in the drawings, an electrode electrically connected to each of the first type semiconductor layer 120 and the second type semiconductor layer 158 may be formed. A voltage may be applied to the electrodes for injecting electrons and holes into the active layer 156. The structure of the electrodes may vary. For example, the electrodes may have a vertical structure, a mesa-type structure, a vertical-horizontal structure, etc., depending on whether the substrate 110 is conductive and/or a direction of light emission.

In the LEDs according to example embodiments, a current spreading layer is inserted into the nanostructures. Accordingly, a current concentration on a given, desired or predetermined portion during light emission is suppressed and/or prevented. As a result, light uniformity may be improved and/or light efficiency may be increased.

It should be understood that the example embodiments described therein should be considered in a descriptive sense only and not for purposes of limitation. Descriptions of features or aspects within each example embodiment should typically be considered as available for other similar features or aspects in other example embodiments.

What is claimed is:

1. A light-emitting device (LED) comprising:
   a plurality of nanostructures on a first type semiconductor layer, each of the plurality of nanostructures including,
      a first type semiconductor nanocore on a portion of the first type semiconductor layer,
      a current spreading layer adjacent to the first type semiconductor nanocore, the current spreading layer being formed of a $Al_xGa_{1-x}N(0<x<1)$/GaN superlattice structure,
      an active layer configured to emit light, and
      a second type semiconductor layer on the active layer,
      wherein the active layers of each of the plurality of nanostructures are directly connected to one another.

2. The LED of claim 1, wherein the current spreading layer is formed to cover a surface of the first type semiconductor nanocore, and the active layer is formed on a surface of the current spreading layer.

3. The LED of claim 2, wherein the $Al_xGa_{1-x}N(0<x<1)$ is undoped, and the GaN is doped with a first type of impurity.

4. The LED of claim 2, wherein the $Al_xGa_{1-x}N(0<x<1)$ and GaN are doped with a first type of impurity and a doping density of the $Al_xGa_{1-x}N(0<x<1)$ is lower than a doping density of the GaN.

5. The LED of claim 2, wherein the $Al_xGa_{1-x}N(0<x<1)$ is in a range of about $0.1<x<0.3$.

6. The LED of claim 2, wherein thicknesses of the $Al_xGa_{1-x}N(0<x<1)$ and the GaN are each in the range from about 10 Å to about 100 Å, inclusive.

7. The LED of claim 2, further comprising:
   a mask layer formed on a surface of the first type semiconductor layer and including a plurality of through holes;
   wherein the first type semiconductor nanocore of each of the plurality of nanostructures is grown through one of the plurality of through holes.

8. The LED of claim 2, wherein each of the plurality of nanostructures has one of a conical and pyramid shape.

9. The LED of claim 2, wherein each of the plurality of nanostructures has a bar shape.

10. A light-emitting device (LED) comprising:
    a plurality of nanostructures on a first type semiconductor layer, each of the plurality of nanostructures including,
       a first type semiconductor nanocore on a portion of the first type semiconductor layer,
       a current spreading layer adjacent to the first type semiconductor nanocore, the current spreading layer being formed of a $Al_xGa_{1-x}N(0<x<1)$/GaN superlattice structure, and the GaN being doped with a first type of impurity,
       an active layer configured to emit light, and
       a second type semiconductor layer on the active layer;
    wherein
       the first type semiconductor nanocore includes a first lower portion and a second upper portion,
       the current spreading layer is embedded in the first type semiconductor nanocore such that the current spreading layer is on a surface of the first lower portion of the first type semiconductor nanocore, and between the first lower portion of the first type semiconductor nanocore and the second upper portion of the first type semiconductor nanocore, and
       the active layer is on the second upper portion of the first type semiconductor nanocore.

11. The LED of claim 10, wherein the $Al_xGa_{1-x}N(0<x<1)$ is undoped.

12. The LED of claim 10, wherein the $Al_xGa_{1-x}N(0<x<1)$ is doped with a first type of impurity and a doping density of the $Al_xGa_{1-x}N(0<x<1)$ is lower than a doping density of the GaN.

13. The LED of claim 10, wherein the $Al_xGa_{1-x}N(0<x<1)$ is in a range of about $0.1<x<0.3$.

14. The LED of claim 10, wherein thicknesses of the $Al_xGa_{1-x}N(0<x<1)$ and the GaN are each in the range from about 10 Å to about 100 Å, inclusive.

15. The LED of claim 10, further comprising:
    a mask layer formed on a surface of the first type semiconductor layer and including a plurality of through holes;
    wherein the first type semiconductor nanocore of each of the plurality of nanostructures is grown through one of the plurality of through holes.

16. The LED of claim 10, wherein each of the plurality of nanostructures has one of a conical and pyramid shape.

17. The LED of claim 10, wherein the active layers of each of the plurality of nanostructures are spaced apart from one another.

18. The LED of claim 10, wherein the active layers of each of the plurality of nanostructures are connected to one another.

19. The LED of claim 10, wherein each of the plurality of nanostructures has a bar shape.

* * * * *